United States Patent
Torres et al.

(10) Patent No.: US 7,553,739 B2
(45) Date of Patent: Jun. 30, 2009

(54) INTEGRATION CONTROL AND RELIABILITY ENHANCEMENT OF INTERCONNECT AIR CAVITIES

(75) Inventors: Joaquin Torres, St. Martin le Vinoux (FR); Laurent-Georges Gosset, Crolles (FR)

(73) Assignees: STMicroelectronics (Corlles 2) SAS, Crolles (FR); Koninklijke Philips Electronics N.V., Eindhoven (NL)

( * ) Notice: Subject to any disclaimer, the term of this patent is extended or adjusted under 35 U.S.C. 154(b) by 358 days.

(21) Appl. No.: 11/456,657

(22) Filed: Jul. 11, 2006

(65) Prior Publication Data
US 2007/0054485 A1 Mar. 8, 2007

(30) Foreign Application Priority Data
Jul. 12, 2005 (EP) .................. 05291505

(51) Int. Cl.
*H01L 21/44* (2006.01)
*H01L 23/48* (2006.01)
(52) U.S. Cl. .................. 438/421; 438/619; 257/750; 257/752
(58) Field of Classification Search .................. 438/421, 438/619, 637, 643, 645, 653, 687; 257/750, 257/751, 752, 758, 759, 762
See application file for complete search history.

(56) References Cited

U.S. PATENT DOCUMENTS

| | | | | |
|---|---|---|---|---|
| 6,413,854 | B1 * | 7/2002 | Uzoh et al. | 438/637 |
| 7,084,479 | B2 * | 8/2006 | Chen et al. | 257/522 |
| 7,294,934 | B2 * | 11/2007 | Kloster et al. | 257/759 |
| 2004/0099951 | A1 | 5/2004 | Park et al. | |
| 2004/0099952 | A1 | 5/2004 | Goodner et al. | |
| 2004/0102031 | A1 | 5/2004 | Kloster et al. | |
| 2005/0087875 | A1 | 4/2005 | Furukawa et al. | |

OTHER PUBLICATIONS

European Search Report dated Oct. 13, 2006 for European Application No. EP 06291019.

* cited by examiner

*Primary Examiner*—Kevin M Picardat
(74) *Attorney, Agent, or Firm*—Lisa K. Jorgenson; Jose Gutman; Fleit Gibbons Gutman Bongini & Bianco P.L.

(57) ABSTRACT

An improved semiconductor device, integrated circuit, and integrated circuit fabrication method introduce highly controlled air cavities within high-speed copper interconnects. A polymer material is introduced on the edges of interconnect lines and vias within an interconnect stack. This incorporates and controls air cavities formation, thus enhancing the signal propagation performance of the semiconductor interconnects.

21 Claims, 6 Drawing Sheets

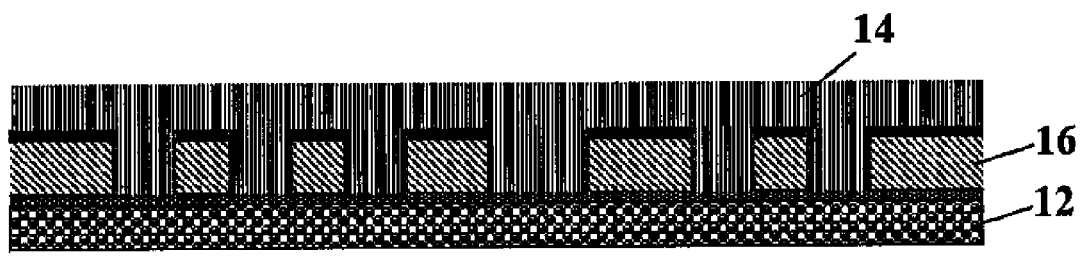
FIG. 2E
FIG. 2F
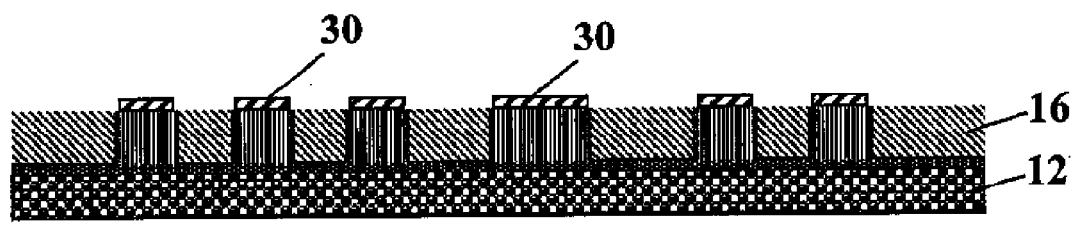
FIG. 2G
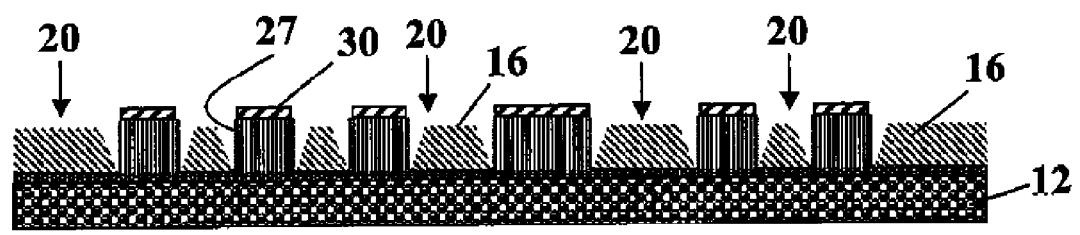
FIG. 2H1
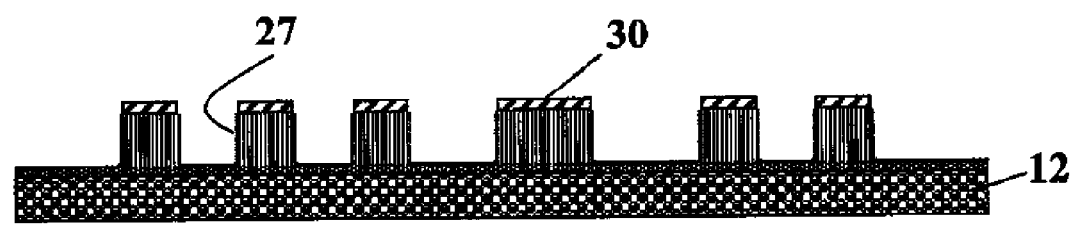
FIG. 2H2

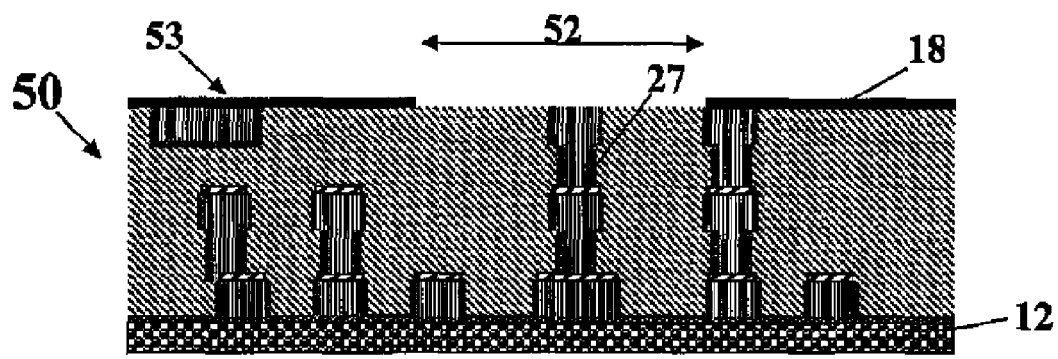
FIG. 3A
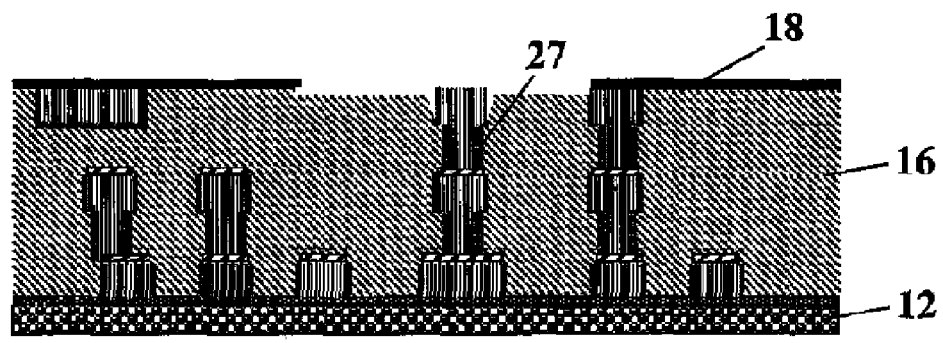
FIG. 3B
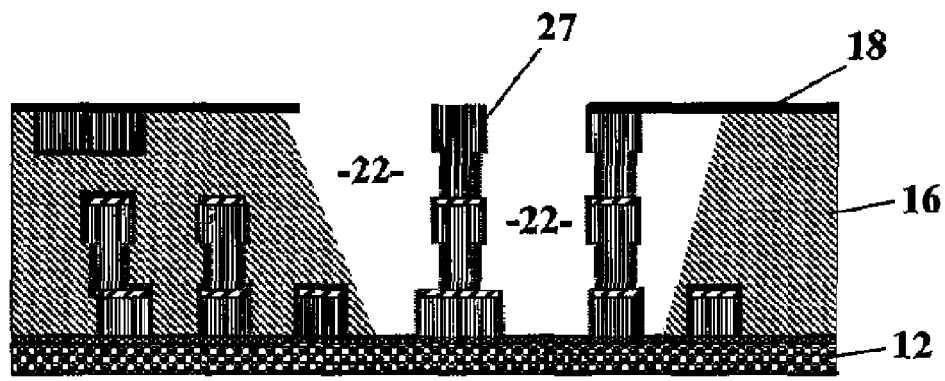
FIG. 3C1

FIG. 3C2

INTEGRATION CONTROL AND RELIABILITY ENHANCEMENT OF INTERCONNECT AIR CAVITIES

CROSS-REFERENCE TO RELATED APPLICATION

This application is based upon and claims priority from prior European Patent Application No. 05291505.5, filed on Jul. 12, 2005, the entire disclosure of which is herein incorporated by reference.

BACKGROUND OF THE INVENTION

1. Field of the Invention

The present invention relates to the field of fabrication of integrated circuits, and more particularly to integration and control of IC interconnect air cavities within interconnect stacks.

2. Description of the Related Art

A semiconductor device such as an IC (integrated circuit) has electronic circuit elements such as transistors, diodes and resistors fabricated integrally on a single body of semiconductor material. Advances in semiconductor materials and processing techniques have resulted in reducing the overall size of the IC circuit elements while increasing their number on a single body. Additional miniaturization is highly desirable for improved IC performance and cost reduction.

Typically, device interconnections in Very Large Scale Integrated (VLSI) or Ultra-Large Scale Integrated (ULSI) semiconductor chips are effected by multilevel interconnect structures containing patterns of metal wiring layers. Wiring structures within a given level are separated by an intralevel dielectric forming horizontal connections between electronic circuit elements, while the individual wiring levels are separated from each other by layers of an interlevel dielectric. Conductive vias are formed in the interlevel dielectric to provide interlevel contacts between the wiring traces and form vertical connections between the electronic circuit elements, resulting in layered connections.

By means of their effects on signal propagation delays and performance (e.g., time delay, crosstalk), the materials and layout of these interconnect structures can substantially impact chip speed, and thus IC performance. Signal-propagation delays are due to RC time constants ('R' is the resistance of the on-chip wiring, and 'C' is the effective capacitance between the signal lines and the surrounding conductors in the multilevel interconnection stack). RC time constants are reduced by lowering the specific resistance of the wiring material, and by using interlevel and intralevel dielectrics (ILDs) with lower dielectric constants k.

In particular, to further reduce the size of devices on ICs, it has become necessary to use conductive materials having low resistivity and to use insulators having a low dielectric constant (dielectric constant k of less than 4.0) to also reduce the capacitive coupling between adjacent metal lines. A typical metal/dielectric combination for low RC interconnect structures is copper (Cu) with a dielectric such as silicon dioxide $SiO_2$ (dielectric constant of about 4.0).

Methods of manufacturing interconnects having copper containing materials have been developed where copper-containing interconnect structures are typically fabricated by a "damascene" process. In a typical damascene process, metal patterns, which are inset in a layer of dielectric, are formed by the steps of etching holes (for vias) or trenches (for wiring) into the interlevel or intralevel dielectric, optionally, lining the holes or trenches with one or more adhesion or diffusion barrier layers, overfilling the holes or trenches with a metal wiring material (e.g., copper), and removing the metal overfill by a planarizing process such as chemical-mechanical polishing (CMP), leaving the metal even with the upper surface of the dielectric. And the above-mentioned processing steps are often repeated until the desired number of wiring and via levels have been fabricated.

Fabrication of interconnect structures by damascene processing can be substantially simplified by using a process variation known as "dual damascene," in which patterned cavities for the wiring level and its underlying via level are filled in with metal in the same deposition step. Dual damascene reduces the number of metal polishing steps by a factor of two, providing substantial cost savings. Dual damascene simply includes forming a trench and an underlying via hole.

Further, in addition to using copper, the use of low k dielectric materials are in heavy demand as they reduce the capacitance between interconnects and improve the switching speed of IC's. When forming vertical and horizontal interconnects by damascene or dual damascene techniques, one or more low k dielectric materials are deposited and pattern etched to form the vertical interconnects, e.g., vias, and horizontal interconnects, e.g., lines.

In back-end-of-line (BEOL) processing, important changes have included the replacement of low-k dielectrics with ultralow-k dielectrics such as air gaps as they have the lowest k value of any material (k value of about 1.0).

Thus, to fulfill future interconnect integration requirements with respect to time delay, cross talk, power dissipation, and to overcome packaging issues, the use of air gaps as the ultimate low-k inter metal dielectric has been widely implemented. As a result, specific areas may be defined where air gaps must be introduced in the interconnect stack.

Typically, as illustrated in FIGS. 1A-1B, integration schemes for forming air cavities within an interconnect stack, after all the levels where air cavities are required were integrated, are based on a removal technique, adapted to the sacrificial material used for the integration. For example, on an interconnect stack 10 as shown in FIG. 1A, above a substrate 12, copper metal lines 14 are integrated within an Undoped Silicate Glass (USG) 16, e.g., $SiO_2$, as a sacrificial material with a SiC (Silicon Carbide) hard mask 18, it has been proposed to use wet or gaseous HF (Hydrofluoric Fluoride) attack 20 to isotropically attack the USG 16 and introduce air cavities 22 homogeneously within the stack 10 (FIG. 1B). Generally, HF chemistry is a technique used to remove sacrificial materials from the interconnect stack. However, different chemistry treatments may also be used, depending on the composition of the sacrificial material within the stack, such as vapour, gaseous, wet treatments, supercritical $CO_2$ as a solvent or agent, and the like.

In order to achieve the mechanical stability of the entire interconnect stack 10, during integration as well as during the packaging of the ICs, it is desirable to precisely localize the region on the surface of the integrated circuit wafers where the air cavities are required. In other words, a region 24 is specified for the introduction of air cavities (see FIG. 1B). Typically the region 24 is found only in dense areas with narrow lines, where the best and highest propagation performances are required (FIG. 1B). An example of a resulting stack after a diluted HF attack mechanism has been performed is illustrated in FIG. 1B, in association with the hard mask 18 with the large open area 24 to define the surface region of the stack 10 initially exposed to the HF attack 20.

However, with this technique, because the HF attack 20 must reach the sacrificial material USG 16 to initiate its decomposition, the cavities 22 are first introduced at the upper-metal level. When such isotropic removal techniques are used, the regions with the air cavities 22 may become much larger than initially required (FIG. 1B).

Another concern is that the treatment duration may affect the metal line integrity due to the long removal process, for example, the long HF attack 20 exposure in the case of TiN (Titanium Nitride), a Physical Vapor Deposition technique such as Vacuum Deposited Coating, or TaN Cu (Tantalum Nitride Copper seed) diffusion barriers may affect the copper interconnect reliability.

Accordingly, there exists a need for overcoming the disadvantages of the prior art as discussed above.

SUMMARY OF THE INVENTION

Accordingly, the invention aims to provide a solution to these problems. In particular, there is a continuing need for developing a new and improved method in which air gaps can be formed in an interconnect that addresses the above mentioned problems.

Briefly described, one object of the invention is to provide a method of fabricating an integrated circuit by the steps of a providing an interconnect stack having a substrate with at least one layer of sacrificial dielectric material formed thereon; of etching at least a trench in the dielectric layer; depositing polymer material to form a polymer liner within the trench; of removing excess polymer material so that the polymer liner remains at least on an edge of the trench; at least partially filling the trench with a metallization layer; of planarizing the interconnect stack by removing any overfill of the metallization layer; and of forming a self-aligned barrier above the metallization layer to finally form at least one air cavity within the interconnect stack by partially removing the sacrificial dielectric material using a removal agent.

Specifically, other features of the method are further recited in the dependent claims. In embodiments of the invention, one or more of the following features may also be included.

In an aspect, method also includes repeating as many times as there are levels in the interconnect stack, the steps of etching the trench in the dielectric layer, depositing the polymer material liner within the trench, removing the excess polymer liner, partially filling the trench with the metallization layer, planarizing the interconnect stack, and forming the self-aligned barrier, prior to the step of forming the air cavity.

In another aspect, the polymer liner includes a material comprising at least one low dielectric constant organic polymer resin. Also, the low-dielectric constant organic polymer resin may include an aromatic hydrocarbon based polymer material or a benzocyclobutene based material.

Further, partially removing the sacrificial dielectric material includes isotropically treating the dielectric material using a wet or gaseous chemical treatment to remove the sacrificial dielectric material.

In yet another aspect, the method further includes defining a portion on the surface of the substrate of the stack as being specific to air cavity introduction and the defined portion is smaller than the surface of the substrate.

In addition, the sacrificial dielectric material within the interconnect stack includes a multi-layer structure made of a hybrid material having a low or ultra-low dielectric constant material and a permeable material permitting diffusion of the removal agent through it.

Moreover, the method may also include replacing the steps of removing the polymer liner, filling the trench with the metallization layer, and forming the self-aligned barrier with the steps of depositing a hard mask on a surface of the interconnect stack prior to depositing the permeable polymer layer to fill the trench; removing the excess permeable polymer layer including the hard mask layer; and depositing another hard mask layer and etching therein a defined area for the diffusion of the removal agent. And other features of the method are further recited in the dependent claims.

According to another aspect of the invention, an integrated circuit includes a semiconductor interconnect stack having at least one sacrificial dielectric material; at least one trench (26) in the dielectric layer; a polymer liner deposited on an edge of the trench that is subsequently partially filled with a metallization layer; a self-aligned barrier formed above a planarized metallization layer having no overfill of the metallization layer; and at least one air cavity within the interconnect stack formed by partially removing the sacrificial dielectric material by using a removal agent.

Specifically, in embodiments of the invention, one or more of the following features may also be included. The polymer liner is a material based on low-dielectric constant organic polymer resins. The low-dielectric constant organic polymer resin includes an aromatic hydrocarbon based polymer material or a benzocyclobutene based material. As yet another feature, the sacrificial dielectric material within the interconnect stack is a multi-layer structure made of a hybrid material having a low or ultra-low dielectric constant material and a permeable material permitting diffusion of the removal agent through it. And other features of the integrated circuit device are further recited in the dependent claims.

Embodiments may have one or more of the following advantages.

The present method provides an improved integrated circuit and integrated circuit fabrication method to introduce highly controlled air cavities within high-speed copper interconnects based on the introduction of a polymer material on the edges of the interconnect lines and vias within the interconnect stack, which incorporates and controls air cavities formation, thus enhancing the signal propagation performances of the semiconductor interconnects.

BRIEF DESCRIPTION OF THE DRAWINGS

Other features and advantages of the present invention will become apparent in the following description of non-limiting exemplary embodiments, making reference to the appended drawings, in which:

FIGS. 3A-3D show sequential cross-sectional views of an integrated circuit interconnect structure in accordance with another embodiment of the present invention.

DETAILED DESCRIPTION

The figures discussed herein, and the various embodiments used to describe the principles of the present invention are by way of illustration only and should not be construed in any way to limit the scope of the invention. Those of ordinary skill in the art will understand that the principles of the present invention may be implemented in any suitably arranged semiconductor device such as an integrated circuit device.

In these figures, for the sake of clarity, the dimensions of the various circuit parts have not been drawn to scale. All these figures are sectional views of a semiconductor device comprising various materials attached to an approximately plane surface of a semiconductor substrate. The sectional views are considered in planes perpendicular to the surface of the substrate 12. In the figures, identical references correspond to identical elements, unless otherwise indicated or shown. The substrate is placed in the lower part of each figure. Moreover, the elementary process steps carried out using methods known to those of ordinary skill in the art will not be explained in detail below. Information is given only regarding the combination of these elementary steps in a defined chronological order of execution that characterizes the invention.

Figure 2A:
FIGS. 2A-2H2 show sequential cross-sectional views of an integrated circuit interconnect structure in accordance with one embodiment of the present invention.
Figure 2B:
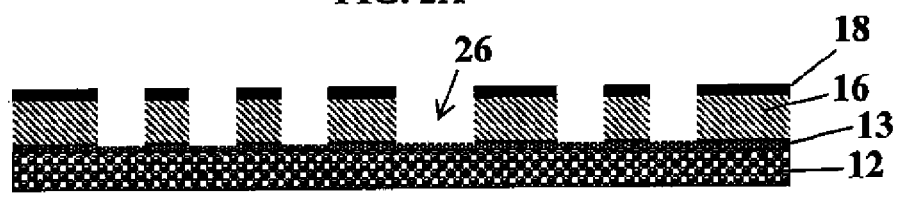

Referring now to FIGS. 2A-2H2, the basic steps of the present invention for forming air gaps are illustrated. The interconnect stack includes the substrate 12 that supports a dielectric liner 13 (e.g., SiN or SiC), a sacrificial layer of dielectric material 16 (e.g., UGS $SiO_2$), another dielectric hard mask liner 18 and a lithographic etching layer 19.

Figure 2C:
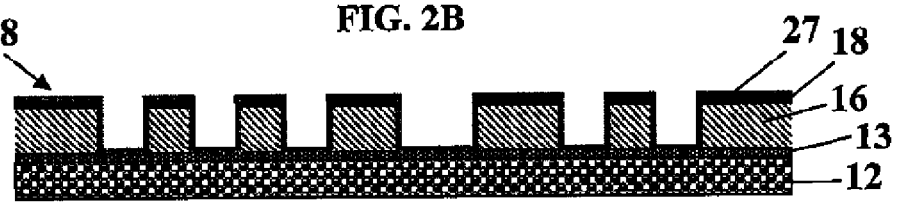
Figure 2D:
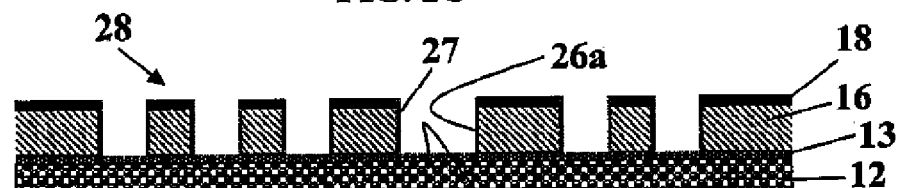

In a first step (FIG. 2B), a lithography process is carried out on the interconnect stack 10 to pattern several trenches 26. Then, next, a thin liner 27 of low-dielectric constant organic polymer resin, either SiLK™ (aromatic hydrocarbon based polymer) or BCB™ (benzocyclobutene), both manufactured by Dow Chemical® of Midland (Mich.), USA, is deposited using CVD (chemical vapour deposition) or PECVD (plasma enhanced chemical vapour deposition) techniques on the surface 28 of the interconnect stack 10 (FIG. 2C). Subsequently, after the polymer in excess on the surface 28 is removed using an appropriate treatment such as a RIE (reactive ion etching) plasma treatment, the thin liner 27 remains only on the edges 26a of the trenches 26 but not on the bottom 26b of the trenches 26, as illustrated in FIG. 2D. For example, the organic polymer chosen has the characteristics of permitting a high HF diffusion or attack on the interconnect stack 10.

Figure 1A:
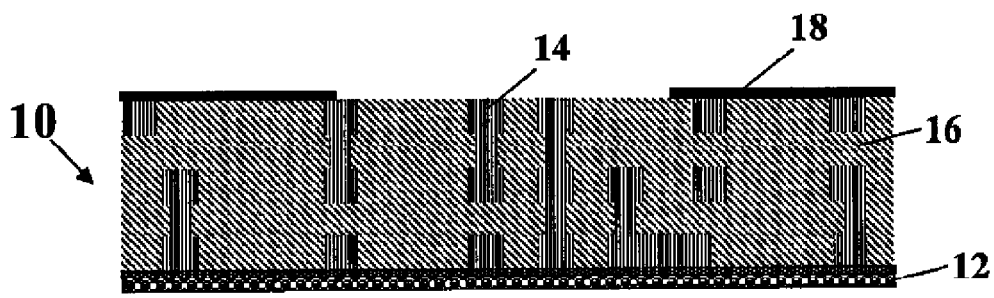
FIGS. 1A-1B show cross-sectional views of an integrated circuit interconnect structure with and without air cavities introduction.
Figure 1B:
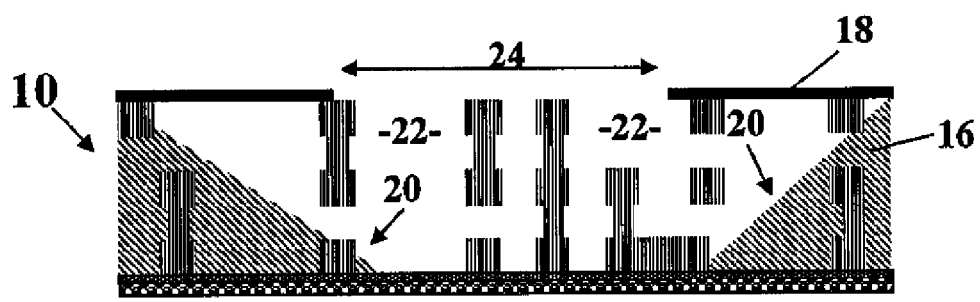

Thereafter, as shown in FIG. 2E, a metallization step depositing a layer of copper metal 14 is carried out, immediately followed by a copper layer processing, namely, a CMP (chemical mechanical polishing) process. CMP is an enabling technology for copper damascene providing adequate local and global surface planarization (see FIG. 2F). Then, a self-aligned barrier (SAB) 30 such as a CoWP (cobalt tungsten phosphide) cap is deposited above the metal lines 14 to encapsulate the copper and protect it from the next removal treatment (FIG. 2G). Subsequently, a HF diffusion or attack 20 is carried out by submitting the interconnect stack 10 to a chemical treatment, for example, the HF removal treatment, by either wet or gaseous means, as illustrated in FIG. 2H1. As the HF diffuses through the polymer liner 27 to the lower regions of the stack 10, the removal of the sacrificial layer of dielectric material 16 (e.g., UGS $SiO_2$) is rapidly initiated (FIG. 2H1). After a short exposure time to the HF attack 20, the USG layer 16 is completely removed from the interconnect stack 10 (FIG. 2H2).

Figure 3D:
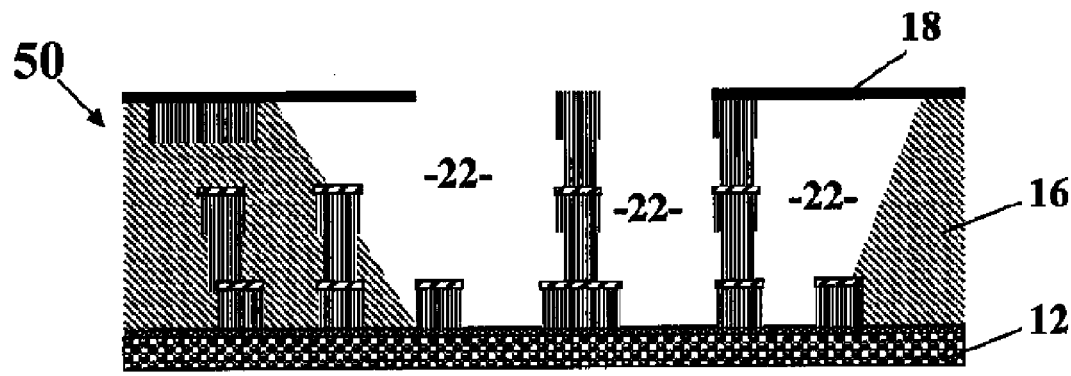
Figure 3D:
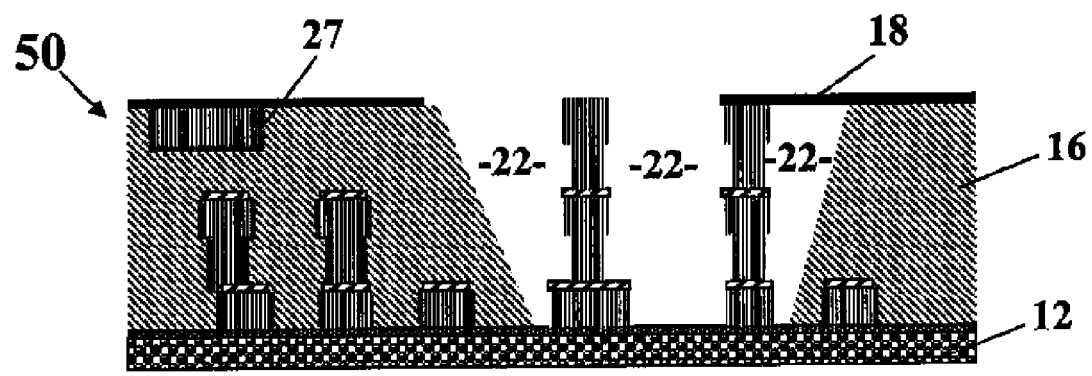

In subsequent optimization processes, referring now to FIGS. 3A-3D, a complete interconnect stack 50 is shown, for sequential basic steps for the introduction of air cavities. In other words, several metallic elements have been added by repeating the steps for the production of a metallization level of the final circuit a number of times in order to obtain separate metallization levels, with each metallization level acting as the substrate for the following subsequent metallization level, and so forth. Also, FIG. 3A shows a defined portion 52 on a surface 53 of the substrate 12 of the integrated circuit interconnect stack 50 as being specific to air cavity introduction, with the defined portion 52 being smaller than an area of the interconnect stack 50.

As the deposited SiLK™ or BCB™ layer 27 enhances HF diffusion through the USG layers 16 isotropically from top to bottom, the metal lines will be less exposed or submitted to the removal agent HF, as illustrated in FIGS. 3B and 3C1. Consequently, air cavities formation will be more expeditious and gentler than if it had been carried out using conventional standard integration procedures without the presence of the polymer SiLK™ or BCB™ layer 27. Furthermore, it also limits the distribution of the air cavities 22 within the interconnect stack. This contrast can be seen by comparing FIG. 3C1 and FIG. 3C2, where in the latter illustration, no polymer SiLK™ or BCB™ layer 27 has been added. In other words, the air cavities 22 formation process can be advantageously less design dependent in the case of FIG. 3C1.

Furthermore, referring now to FIG. 3D, another optimization that can be performed is to completely remove the remaining SiLK™ or BCB™ layer 27 within the air cavity area 22 of the interconnect stack 10 by using an adapted process if keeping the polymer layers within the air cavities in terms of mechanical stability enhancement is unnecessary or not advantageous.

The integration control and reliability enhancement associated with the present invention can also be implemented with multi-layers within the interconnect stack 50 made of a hybrid material such as an USG layer in addition to a permanent porous permeable layer made of SiLK™ material that allows the diffusion of HF through it.

Moreover, other modifications and optimizations of the method can be implemented such as using low-k materials such as SiLK™ or BCB™ materials in the interconnect stack formed as either intrametal dielectric (IMD), i.e., the via level dielectric or Interlevel dielectric (ILD), also known as the trench level dielectric. In addition, metal dummies such as lines or via can be implemented by design in the right areas to fasten the HF diffusion to the lower metal levels of the interconnect.

Referring now to FIGS. 4A-4F, the use of deep trenches filled with a permeable material, as mentioned above, is illustrated. The permeable material used in this optimization is typically SiLK™ or BCB™, which allows the fast diffusion of the removal agent (i.e., HF) from the top through another interconnect stack 55. In this manner, the total duration for the removal of the USG layer 16 at multi level stacks is significantly shortened. That is, the total duration for the entire removal time is approximately equivalent to the removal time of the sacrificial layer/material 16 at the upper metal level.

Figure 4A:
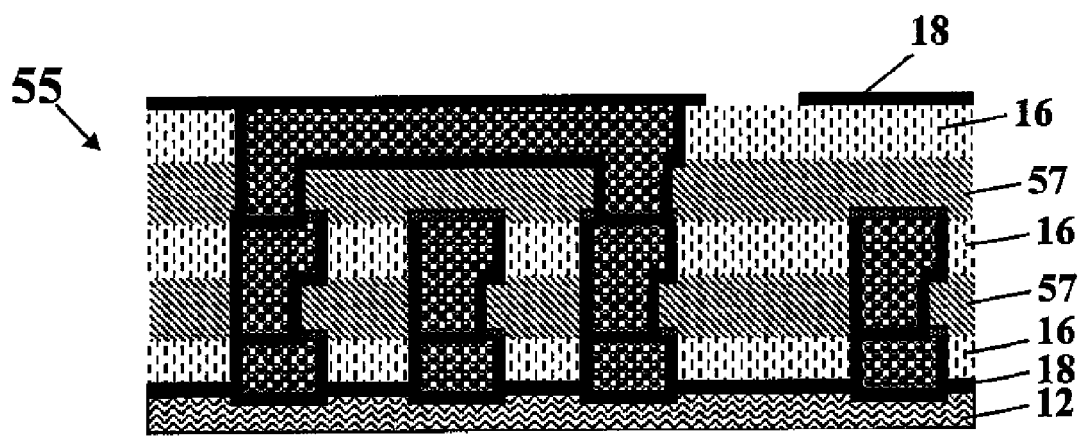
FIGS. 4A-4F show sequential cross-sectional views of another integrated circuit interconnect structure in accordance with yet another embodiment of the present invention.
Figure 4B:
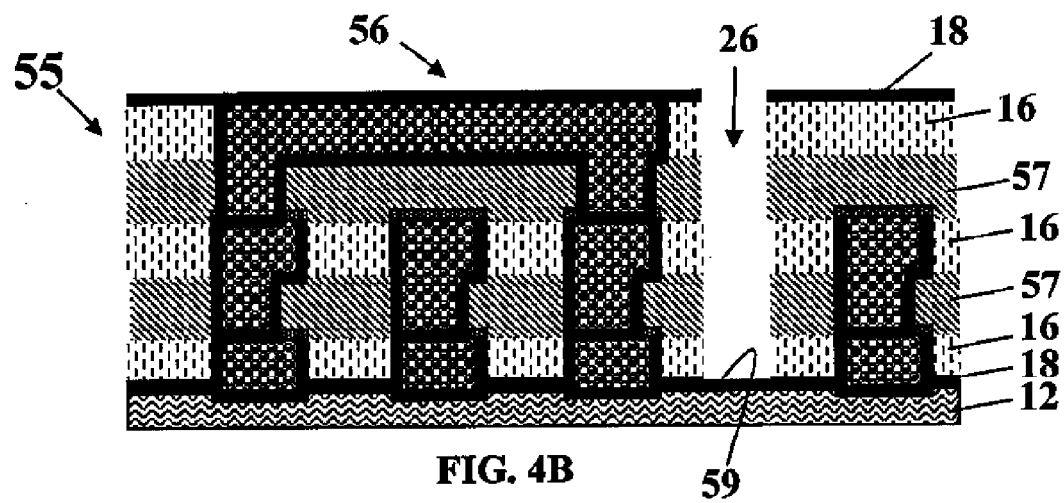
Figure 4C:
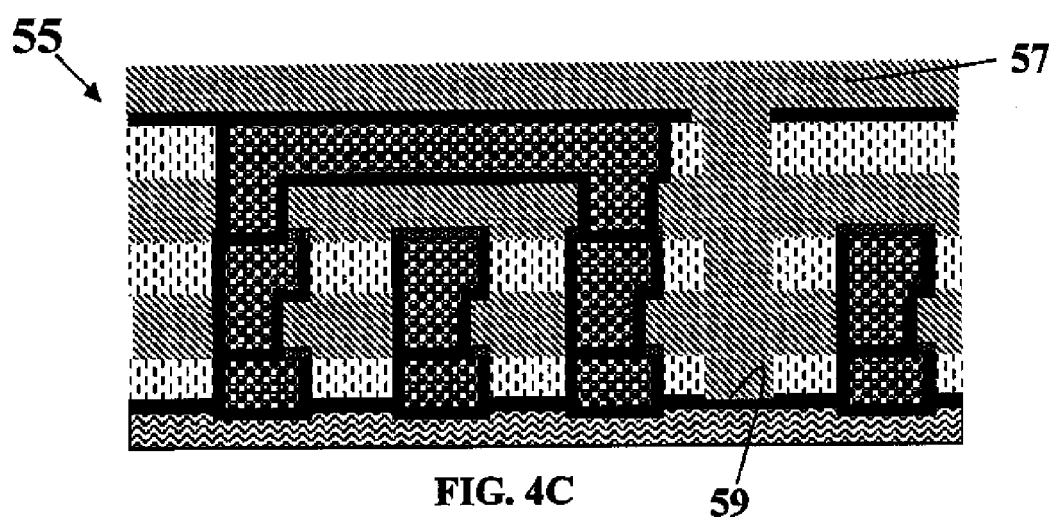
Figure 4D:
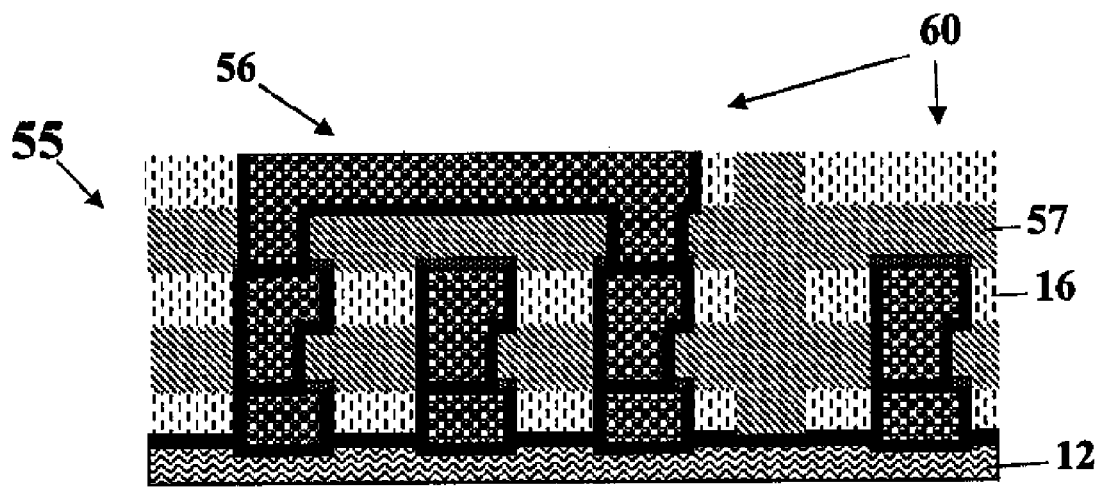

In particular, in FIG. 4A, the interconnect stack 55 is shown with a hard mask 18 deposition (SiC, SiN, etc). The layers of the interconnect 55 include a substrate 12 followed by the hard mask layer 18, a permeable permanent layer of polymer 57, followed by a USG layer 16. After an etching process, a deep trench 26 is formed from a surface 56 of the interconnect stack 55 all the way to a bottom 59, through the complete interconnect stack 55 (FIG. 4B).

Next, a deposition step takes place with the dielectric polymer 57 (SiLK™ or BCB™) filling the trench 26 (FIG. 4C) all the way down to the bottom 59. Then, a chemical mechanical polishing technique 60 is applied to smooth out the surface 56 of the interconnect stack 55 (FIG. 4D), with the resulting stack with the hard mask 18 removed.

Figure 4E:
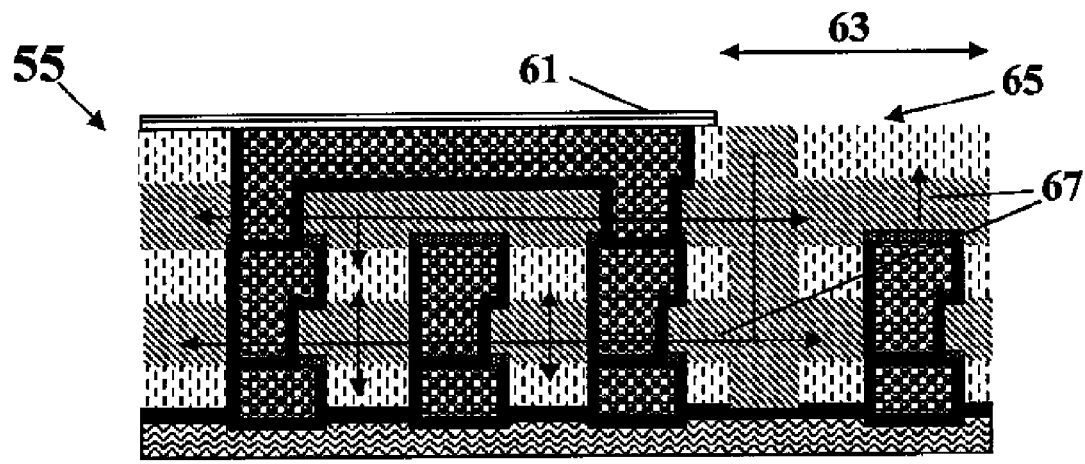
Figure 4F:
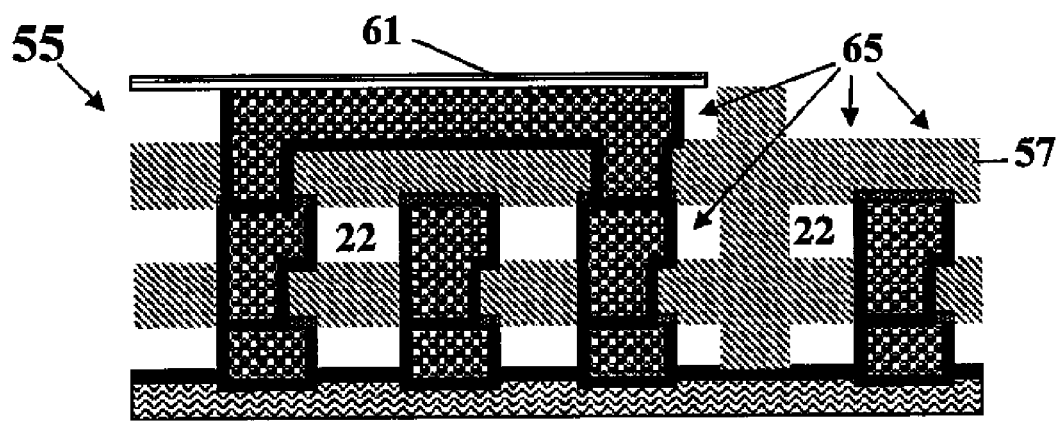

As illustrated in FIG. 4E, a SiC hard mask 61 deposition is performed followed by an etching process of a large area 63 for a subsequent HF diffusion 65 (FIGS. 4E-4F). Since the HF 65 rapidly diffuses through the permeable polymer layers 57, the removal of the USG layers 16 is quasi simultaneously carried out at each of the metal levels, as represented by arrows 67. The final resulting interconnect stack 55 is shown in FIG. 4F with the air cavities 22 formed throughout the stack in between the metal lines.

While there has been illustrated and described what are presently considered to be embodiments of the present invention, it will be understood by those of ordinary skill in the art that various other modifications may be made, and equivalents may be substituted, without departing from the true scope of the present invention.

Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. A method of fabricating an integrated circuit comprising:
   providing a semiconductor interconnect stack having a substrate with at least one layer of sacrificial dielectric material formed thereon;
   etching at least one trench in the dielectric layer;
   depositing a permeable polymer material in the trench;
   removing excess permeable polymer material so that a thin permeable polymer liner remains within the trench at least on an edge of the trench, the thin permeable polymer liner permitting diffusion of a removal agent therethrough;
   at least partially filling the trench with a metallization layer;
   planarizing the interconnect stack by removing any overfill of the metallization layer;
   forming a self-aligned barrier above the metallization layer; and
   forming at least one air cavity within the interconnect stack by partially removing the sacrificial dielectric material by using the removal agent.

2. The method of claim 1, wherein the method further comprises repeating as many times as there are levels in the interconnect stack, the steps of etching the at least one trench in the dielectric layer, depositing the permeable polymer material in the trench, removing the excess permeable polymer material, partially filling the trench with the metallization layer, planarizing the interconnect stack, and forming the self-aligned barrier, prior to or after the step of forming the at least one air cavity.

3. The method according to claim 1, wherein the polymer liner comprises a material comprising at least one organic polymer resin.

4. The method according to claim 3, wherein the organic polymer resin comprises an aromatic hydrocarbon based polymer material.

5. The method according to claim 3, wherein the organic polymer resin comprises a benzocyclobutene based material.

6. The method according to claim 1, wherein removing excess polymer material comprises etching the interconnect stack using reactive ion etching techniques.

7. The method according to claim 1, wherein the step of planarizing the interconnect stack comprises carrying out a chemical mechanical polishing of the metallization layer.

8. The method according to claim 1, wherein the step of forming a self-aligned barrier above the metallization layer comprises forming a self-aligned barrier cap comprising cobalt tungsten phosphide based materials.

9. The method according to claim 1, wherein the step of partially removing the sacrificial dielectric material comprises isotropically treating the dielectric material using a wet or gaseous chemical treatment to remove the sacrificial dielectric material.

10. The method according to claim 1, further comprising defining a portion on a surface of the substrate of an integrated circuit interconnect stack as being specific to air cavity introduction, and wherein the defined portion is smaller than the surface of the substrate.

11. The method according to claim 1, further comprising removing the remaining polymer liner within the air cavity of the interconnect stack, subsequent to the step of forming at least one air cavity by removing the sacrificial dielectric material.

12. The method according to claim 1, wherein the sacrificial dielectric material within the interconnect stack comprises a multi-layer structure made of a low or ultra-low dielectric constant material and a permeable material permitting diffusion of the removal agent through it.

13. The method according to claim 1, wherein the method further comprises replacing the steps of removing the excess permeable polymer material, at least partially filling the trench with the metallization layer, and forming the self-aligned barrier, with the steps of:
   depositing a hard mask on a surface of the interconnect stack prior to depositing the permeable polymer layer to fill the trench;
   removing the excess permeable polymer material including the hard mask layer; and
   depositing another hard mask layer and etching therein a defined area for the diffusion of the removal agent.

14. An integrated circuit comprising:
   a semiconductor interconnect stack having a substrate with at least one layer of sacrificial dielectric material formed thereon, a defined portion on a surface of the substrate of the semiconductor interconnect stack being specific to air cavity introduction, wherein the defined portion is smaller than the surface of the substrate;
   at least one trench in the dielectric layer;
   a polymer liner deposited at least on an edge of the trench that is subsequently at least partially filled with a metallization layer;
   a self-aligned barrier formed above the metallization layer having no overfill of the metallization layer; and
   at least one air cavity within the semiconductor interconnect stack formed by partially removing the sacrificial dielectric material by using a removal agent, wherein the sacrificial dielectric material within the interconnect stack is a multi-layer structure made of a low or ultra-low dielectric constant material and of a permeable material permitting diffusion of the removal agent through it.

15. The integrated circuit according to claim 14, wherein the polymer liner is a material based on organic polymer resins.

16. The integrated circuit according to claim 15, wherein the organic polymer resin comprises an aromatic hydrocarbon based polymer material.

17. The integrated circuit according to claim 15, wherein the organic polymer resin comprises a benzocyclobutene based material.

18. The integrated circuit according to claim 14, wherein the self-aligned barrier formed above the metallization layer is a self-aligned barrier cap comprising cobalt tungsten phosphide based materials.

19. A method of fabricating an integrated circuit comprising:
  providing a semiconductor interconnect stack having a substrate with at least one layer of sacrificial dielectric material formed thereon;
  etching at least one trench in the dielectric layer;
  depositing a hard mask layer on a surface of the interconnect stack prior to depositing a permeable polymer layer to fill the at least one trench;
  removing the hard mask layer;
  removing the excess permeable polymer layer such that a thin permeable polymer liner remains within the at least one trench on an edge of the at least one trench;
  at least partially filling the at least one trench with a metallization layer;
  planarizing the interconnect stack by removing any overfill of the metallization layer;
  depositing another hard mask layer and etching therein a defined area for diffusion of a removal agent; and
  forming at least one air cavity within the interconnect stack by partially removing the sacrificial dielectric material by using the removal agent.

20. The method according to claim 19, wherein the forming of the at least one air cavity comprises diffusing the removal agent through the thin permeable polymer liner.

21. The method according to claim 20, wherein the semiconductor interconnect stack comprises multiple levels of metal interconnects on top of each other, and wherein the removal agent is diffused through the thin permeable polymer liner from top to bottom through at least one level of metal interconnect to a lower level of metal interconnect.

* * * * *